US012615727B2

(12) United States Patent
Chen et al.

(10) Patent No.: US 12,615,727 B2
(45) Date of Patent: Apr. 28, 2026

(54) CONNECTOR AND CHAMBER

(71) Applicant: Delta Electronics, Inc., Taoyuan City (TW)

(72) Inventors: Chien-Hsun Chen, Taoyuan City (TW); Wei-Kai Hsiao, Taoyuan City (TW); Zi-Wei Zeng, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 150 days.

(21) Appl. No.: 18/771,584

(22) Filed: Jul. 12, 2024

(65) Prior Publication Data

US 2025/0203791 A1 Jun. 19, 2025

Related U.S. Application Data

(60) Provisional application No. 63/610,283, filed on Dec. 14, 2023.

(30) Foreign Application Priority Data

May 14, 2024 (CN) .......................... 202410594412.6

(51) Int. Cl.
| | |
|---|---|
| *G06F 1/16* | (2006.01) |
| *H02J 7/70* | (2026.01) |
| *H05K 5/02* | (2006.01) |
| *H05K 5/03* | (2006.01) |

(52) U.S. Cl.
CPC .............. *H05K 5/0226* (2013.01); *H02J 7/70* (2026.01); *H05K 5/03* (2013.01)

(58) Field of Classification Search
CPC ...... H05K 5/0217; H05K 5/0226; H05K 5/03; H01R 13/447; H01R 13/453; H01R 13/4538; H01R 13/501
See application file for complete search history.

(56) References Cited

U.S. PATENT DOCUMENTS

| | | | |
|---|---|---|---|
| 5,413,493 A | 5/1995 | Hoffman | |
| 6,305,957 B1 * | 10/2001 | Fink ................. | H01R 13/62977 439/157 |

(Continued)

FOREIGN PATENT DOCUMENTS

| | | |
|---|---|---|
| AU | 2011201443 A1 | 4/2011 |
| CN | 101813755 A | 8/2010 |

(Continued)

*Primary Examiner* — Anthony Q Edwards
(74) *Attorney, Agent, or Firm* — KIRTON McCONKIE; Evan R. Witt

(57) ABSTRACT

A connector and a chamber are provided. The connector of the chamber includes the first sub connector, the second sub connector and the plurality of foldable connectors. Each wire can be covered by the connector and does not need to be exposed. The wire is protected and organized, and the appearance of the chamber is aesthetically pleasing. Moreover, when the chamber is in the close operation, the protrusion of each sub connector is disposed in the slide track of the former sub connector, and each sub connector is received in the accommodation space of the former sub connector, so that the requirement space of the connector is reduced and the volume of the chamber is reduced.

14 Claims, 8 Drawing Sheets

(56) References Cited

U.S. PATENT DOCUMENTS

| | | | |
|---|---|---|---|
| 2002/0081877 A1* | 6/2002 | Ohnuki | H01R 13/62977 439/157 |
| 2005/0186811 A1* | 8/2005 | Lee | H01R 13/62977 439/76.2 |
| 2011/0221384 A1 | 9/2011 | Scheucher | |
| 2018/0175646 A1 | 6/2018 | Chen | |
| 2022/0200303 A1 | 6/2022 | Swamy et al. | |
| 2022/0385097 A1 | 12/2022 | Lim et al. | |

FOREIGN PATENT DOCUMENTS

| | | |
|---|---|---|
| CN | 102843893 A | 12/2012 |
| CN | 204498544 U | 7/2015 |
| CN | 204857809 U | 12/2015 |
| CN | 205385310 U | 7/2016 |
| CN | 205693400 U | 11/2016 |
| CN | 106787040 A | 5/2017 |
| CN | 206650458 U | 11/2017 |
| CN | 105098899 B | 7/2018 |
| CN | 210470026 U | 5/2020 |
| CN | 210985679 U | 7/2020 |
| CN | 211556931 U | 9/2020 |
| CN | 111800963 A | 10/2020 |
| CN | 211908405 U | 11/2020 |
| CN | 212012169 U | 11/2020 |
| CN | 112186829 A | 1/2021 |
| CN | 212412784 U | 1/2021 |
| CN | 112823460 A | 5/2021 |
| CN | 213279198 U | 5/2021 |
| CN | 214380257 U | 10/2021 |
| CN | 215418360 U | 1/2022 |
| CN | 216086225 U | 3/2022 |
| CN | 218104042 U | 12/2022 |
| CN | 218652851 U | 3/2023 |
| CN | 219145051 U | 6/2023 |
| CN | 219227866 U | 6/2023 |
| CN | 117096995 A | 11/2023 |
| DE | 202021102746 U1 | 6/2021 |
| TW | 181746 U | 4/1992 |
| TW | I425903 B | 2/2014 |
| WO | 2023035392 A1 | 3/2023 |
| WO | 2023153525 A1 | 8/2023 |
| WO | 2023197813 A1 | 10/2023 |
| WO | 2023222454 A1 | 11/2023 |

* cited by examiner

CONNECTOR AND CHAMBER

CROSS-REFERENCE TO RELATED APPLICATION

This application claims the benefit of U.S. Provisional Application No. 63/610,283 filed on Dec. 14, 2023, and entitled "BATTERY CHARGING CHAMBER AND CONTROLLING METHOD THEREOF", the entirety of which is hereby incorporated by reference. This application also claims the priority to China Patent Application No. 202410594412.6 filed on May 14, 2024, the entirety of which is hereby incorporated by reference.

FIELD OF THE INVENTION

The present disclosure relates to a connector and a chamber, and more particularly to a connector and a chamber for reducing the volume.

BACKGROUND OF THE INVENTION

The conventional chamber includes a cover, a box and a wire. The wire is connected between the electronic components disposed in the cover and the electronic components disposed in the box. However, when the chamber is in the open operation, the wire of the chamber is always exposed. The wire has risks of scratching and folding to cause the safety problem of the chamber. Moreover, the appearance of the chamber is not aesthetically pleasing.

Therefore, there is a need of providing a connector and a chamber to obviate the drawbacks encountered from the prior arts.

SUMMARY OF THE INVENTION

The present disclosure provides a connector and a chamber. The connector of the chamber includes the first sub connector, the second sub connector and the plurality of foldable connectors. Each wire can be covered by the connector and does not need to be exposed. The wire is protected and organized, and the appearance of the chamber is aesthetically pleasing. Moreover, when the chamber is in the close operation, the protrusion of each sub connector is disposed in the slide track of the former sub connector, and each sub connector is received in the accommodation space of the former sub connector, so that the requirement space of the connector is reduced and the volume of the chamber is reduced.

In accordance with an aspect of the present disclosure, a connector is provided. The connector is pivotally connected between a box and a cover. The connector includes a first sub connector, a second sub connector and a plurality of foldable connectors. The first sub connector is disposed in the box and includes three lateral walls and a first connector accommodation space defined by the three lateral walls of the first sub connector. A slide track formed on and running through the at least one of the three lateral walls of the first sub connector. The second sub connector is disposed in the cover and includes three lateral walls and a second connector accommodation space defined by the three lateral walls of the second sub connector. A protrusion disposed on an outer surface of at least one of the three lateral walls of the second sub connector. The plurality of foldable connectors are disposed between the first sub connector and the second sub connector in sequence. Each of the plurality of foldable connectors includes three lateral walls and a third connector accommodation space defined by the three lateral walls of each of the plurality of foldable connectors. A slide track formed on and running through the at least one of the three lateral walls of each of the plurality of foldable connectors. A protrusion disposed on an outer surface of the lateral wall having the slide track of each of the plurality of foldable connectors. The protrusion of the first foldable connector of the plurality of foldable connectors is slidably disposed in the slide track of the first foldable connector to make the first foldable connector of the plurality of foldable connectors received in the first connector accommodation space. The protrusion of another foldable connector of the plurality of foldable connectors is slidably disposed in the slide track of former one of the plurality of foldable connectors to make another foldable connector of the plurality of foldable connectors received in the third connector accommodation space of the former one of the plurality of foldable connectors. The protrusion of the second sub connector is slidably disposed in the slide track of last one of the plurality of foldable connectors to make the second sub connector received in the third connector accommodation space of the last one of the plurality of foldable connectors.

In accordance with another aspect of the present disclosure, a chamber is provided. The chamber includes a box, a cover, at least one wire and a connector. The connector is pivotally connected between the box and the cover. The connector covers the at least one wire and includes a first sub connector, a second sub connector and a plurality of foldable connectors. The first sub connector is disposed in the box and includes three lateral walls and a first connector accommodation space defined by the three lateral walls of the first sub connector. A slide track formed on and running through the at least one of the three lateral walls of the first sub connector. The second sub connector is disposed in the cover and includes three lateral walls and a second connector accommodation space defined by the three lateral walls of the second sub connector. A protrusion disposed on an outer surface of at least one of the three lateral walls of the second sub connector. The plurality of foldable connectors are disposed between the first sub connector and the second sub connector in sequence. Each of the plurality of foldable connectors includes three lateral walls and a third connector accommodation space defined by the three lateral walls of each of the plurality of foldable connectors. A slide track formed on and running through the at least one of the three lateral walls of each of the plurality of foldable connectors. A protrusion disposed on an outer surface of the lateral wall having the slide track of each of the plurality of foldable connectors. The protrusion of the first foldable connector of the plurality of foldable connectors is slidably disposed in the slide track of the first foldable connector to make the first foldable connector of the plurality of foldable connectors received in the first connector accommodation space. The protrusion of another foldable connector of the plurality of foldable connectors is slidably disposed in the slide track of former one of the plurality of foldable connectors to make another foldable connector of the plurality of foldable connectors received in the third connector accommodation space of the former one of the plurality of foldable connectors. The protrusion of the second sub connector is slidably disposed in the slide track of last one of the plurality of foldable connectors to make the second sub connector received in the third connector accommodation space of the last one of the plurality of foldable connectors.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
FIG. 1 is a schematic view illustrating the close operation of a chamber of the present disclosure.
Figure 1:
Figure 1:
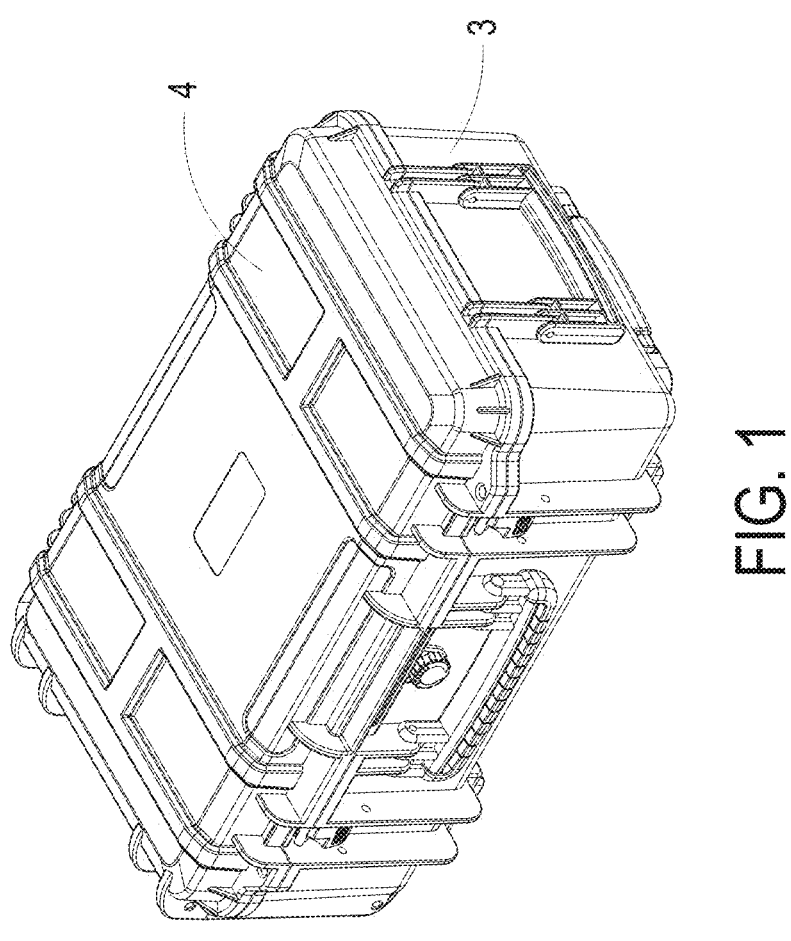
Figure 2:
FIG. 2 is a schematic view illustrating the open operation of the chamber of FIG. 1.
Figure 2:
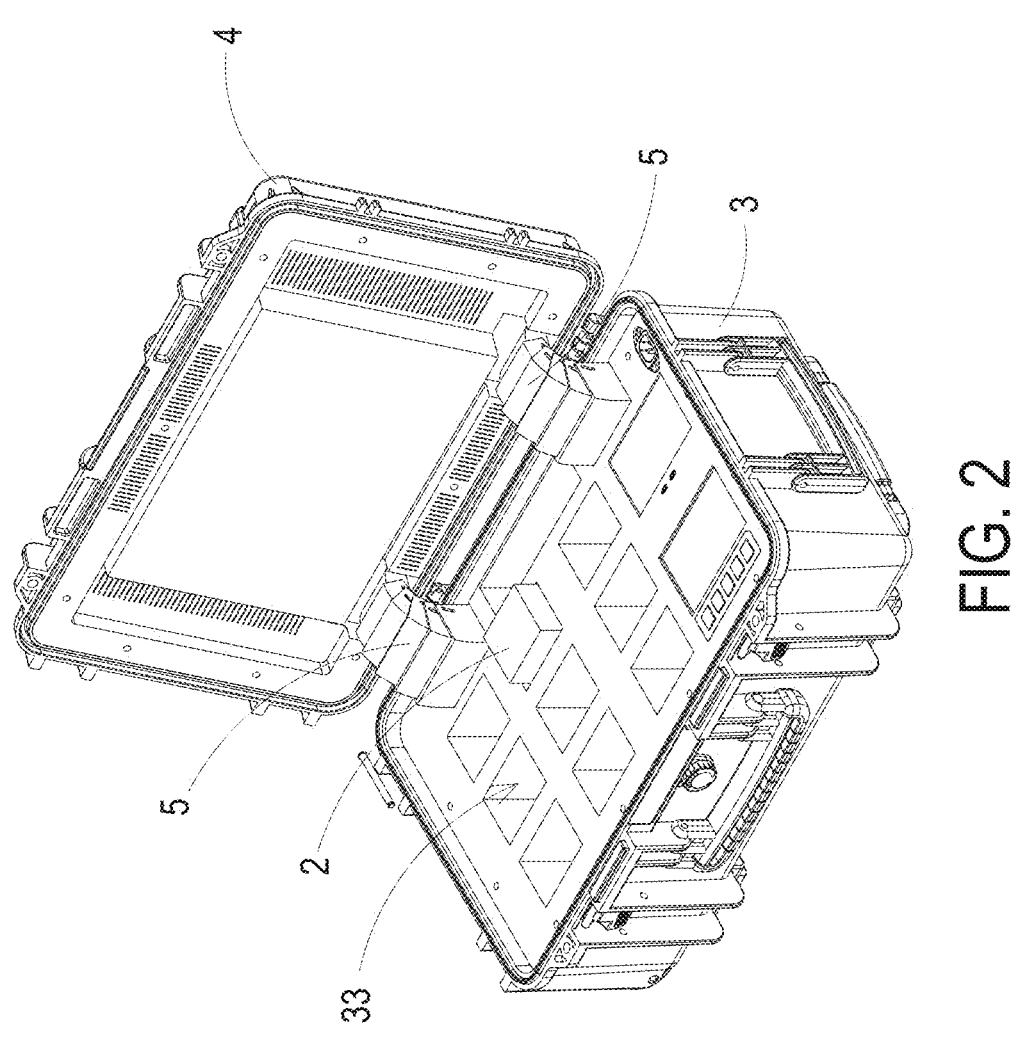
Figure 3:
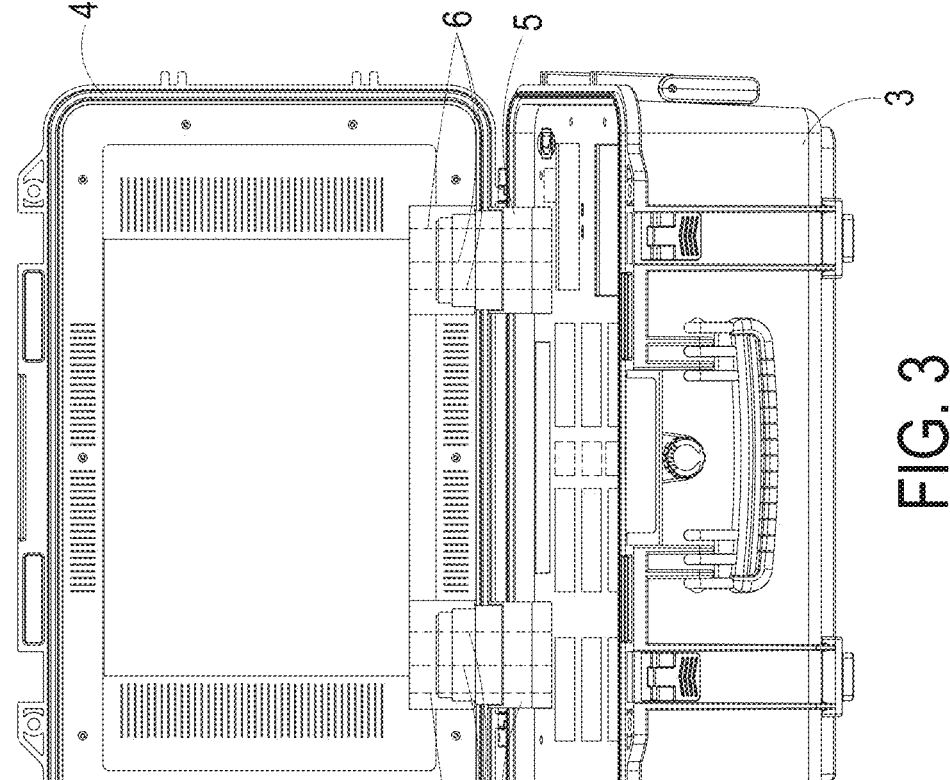
FIG. 3 is a connection structure illustrating the internal wires of the chamber of FIG. 1.

FIG. 1 is a schematic view illustrating the close operation of a chamber of the present disclosure. FIG. 2 is a schematic view illustrating the open operation of the chamber of FIG. 1. FIG. 3 is a connection structure illustrating the internal wires of the chamber of FIG. 1. As shown in FIGS. 1 to 3, the chamber 1 of the present disclosure is a battery charging chamber for charging and discharging a battery 2. The chamber 1 includes a box 3, a cover 4, two connectors 5 and a plurality of wires 6. The cover 4 is pivotally connected with the box 3 through the two connectors 5, so that the cover 4 is able to uncover the box 3. The connector 5 is connected with one side of the box 3 and one side of the cover 4. The cover 4 is rotated relative to the connector 5, so that the cover 4 selectively covers or uncovers the box 3. When the chamber 1 is in the close operation, as shown in FIG. 1, the cover 4 of the chamber 1 is rotated relative to the connector 5 so as to cover the box 3. When the battery 2 needs to be charged by the chamber 1 and the chamber 1 is in the open operation, as shown in FIG. 2, the cover 4 of the chamber 1 is rotated relative to the connector 5 so as to uncover the box 3, so that the receiving concave 33 is exposed for receiving the battery 2. Each wire 6 is connected between the corresponding electronic components (not shown) disposed in the box 3 and the corresponding electronic components (not shown) disposed in the cover 4. Each wire 6 is disposed in the corresponding connector 5. Namely, each wire 6 is covered by the corresponding connector 5. As shown in FIG. 3, each connector 5 covers three wires 6. Certainly, the number of the wire 6 is not limited.

Figure 4:
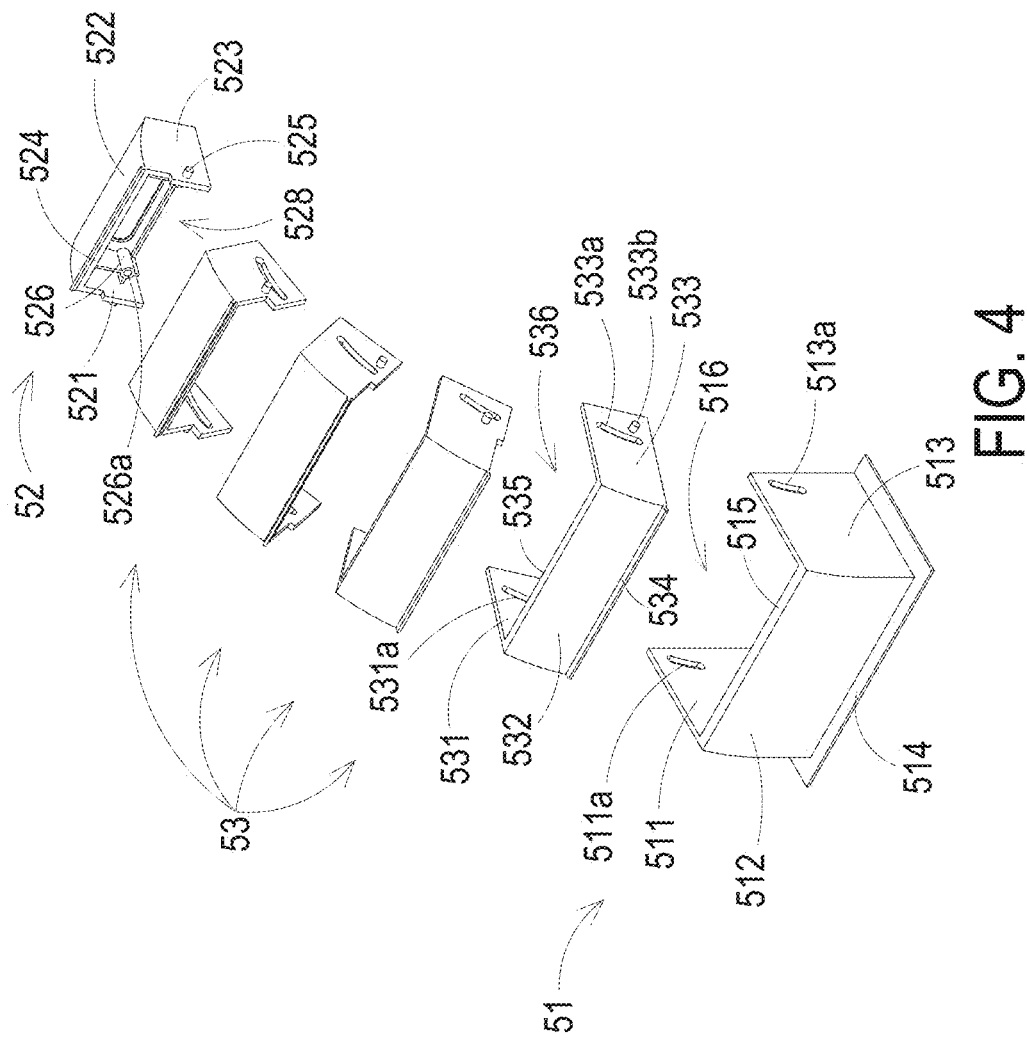
FIG. 4 is a schematic exploded view illustrating a connector of the chamber of FIG. 1.
Figure 5A:
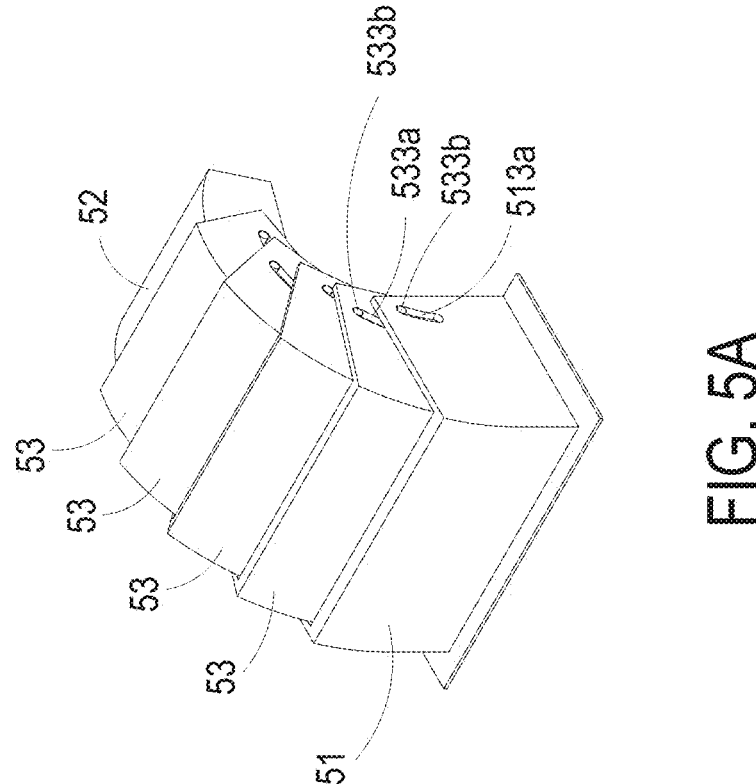
FIG. 5A is a schematic view illustrating the connector of the chamber of FIG. 2 when the chamber is in the open operation.
Figure 5B:
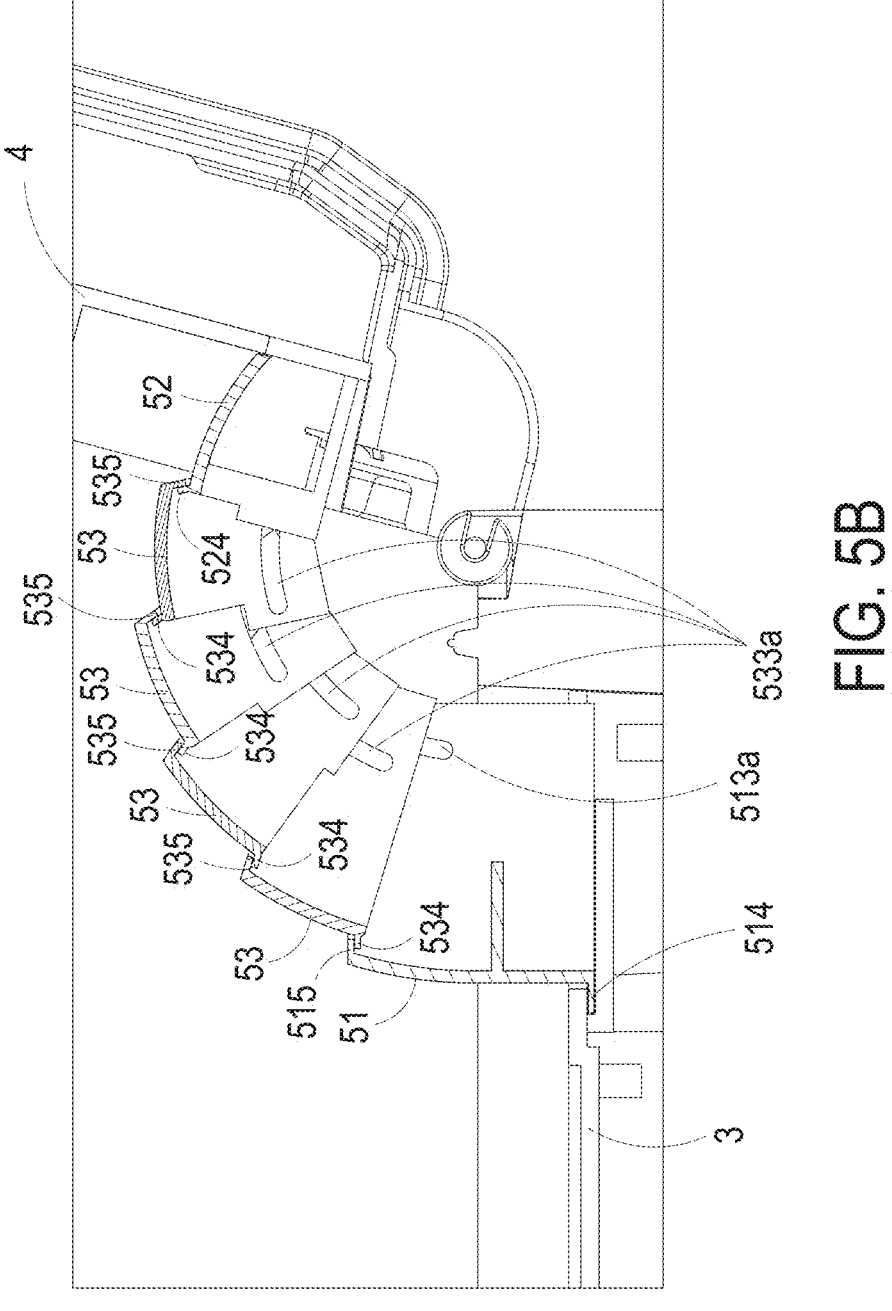
FIG. 5B is a partial schematic cross-sectional view illustrating the chamber of FIG. 2 when the chamber is in the open operation.
Figure 6A:
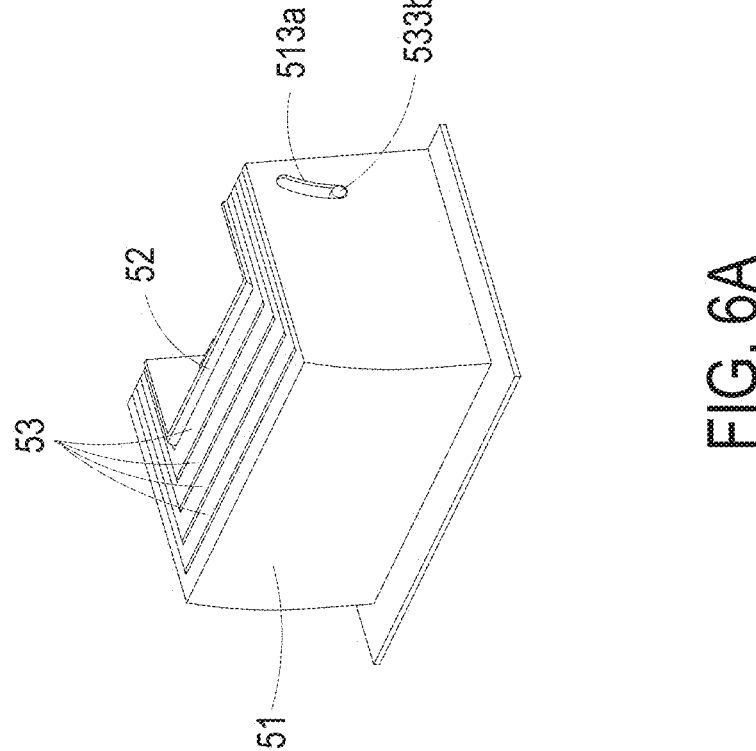
FIG. 6A is a schematic view illustrating the connector of the chamber of FIG. 1 when the chamber is in the close operation.
Figure 6B:
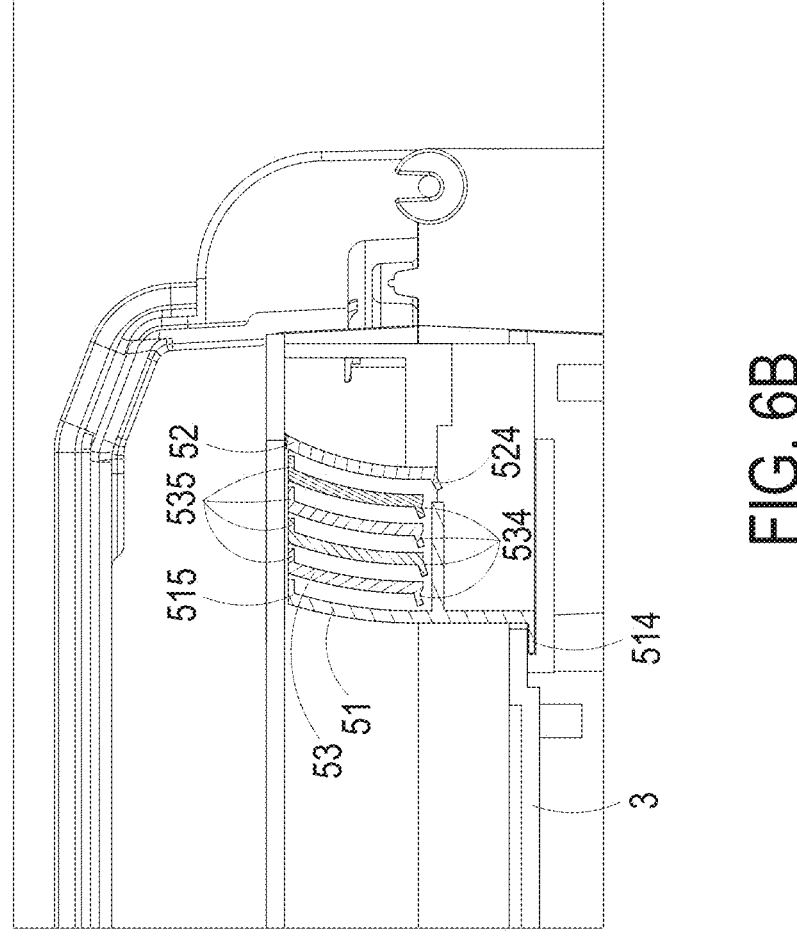
FIG. 6B is a partial schematic cross-sectional view illustrating the chamber of FIG. 1 when the chamber is in the close operation.

FIG. 4 is a schematic exploded view illustrating a connector of the chamber of FIG. 1. FIG. 5A is a schematic view illustrating the connector of the chamber of FIG. 2 when the chamber is in the open operation. FIG. 5B is a partial schematic cross-sectional view illustrating the chamber of FIG. 2 when the chamber is in the open operation. FIG. 6A is a schematic view illustrating the connector of the chamber of FIG. 1 when the chamber is in the close operation. FIG. 6B is a partial schematic cross-sectional view illustrating the chamber of FIG. 1 when the chamber is in the close operation. As shown in FIGS. 2 and 3, one side of each connector 5 of the chamber 1 is connected with the cover 4 by fastening. The other side of each connector 5 of the chamber 1 is connected with the box 3 by engaging.

As shown in FIG. 4, the connector 5 includes a first sub connector 51, a second sub connector 52 and a plurality of foldable connectors 53. The first sub connector 51 includes a first lateral wall 511, a second lateral wall 512, a third lateral wall 513, a first extension portion 514 and a second extension portion 515. The first lateral wall 511, the second lateral wall 512 and the third lateral wall 513 of the first sub connector 51 are arranged in sequence to form a first connector accommodation space 516 collaboratively. In other words, the first connector accommodation space 516 is defined by the three lateral walls of the first sub connector 51. The first lateral wall 511 and the third lateral wall 513 of the first sub connector 51 are opposite to each other. The second lateral wall 512 of the first sub connector 51 is connected between the first lateral wall 511 and the third lateral wall 513. The first extension portion 514 is extended from the bottom of the first lateral wall 511, the bottom of the second lateral wall 512 and the bottom of the third lateral wall 513 away from the first connector accommodation space 516. The first sub connector 51 is inserted into the box 3 by the first extension portion 514 so as to fix the first sub connector 51 in the box 3, as shown in FIG. 5B. The second extension portion 515 is extended from the top of the second lateral wall 512 toward the first connector accommodation space 516. The first lateral wall 511 includes a first slide track 511a. The first slide track 511a is formed on and runs through the first lateral wall 511. The extension direction of the first slide track 511a is from the top toward the bottom of the first lateral wall 511. The third lateral wall 513 includes a second slide track 513a. The second slide track 513a is formed on and runs through the third lateral wall 513. The extension direction of the second slide track 513a is from the top toward the bottom of the third lateral wall 513.

The second sub connector 52 includes a first lateral wall 521, a second lateral wall 522, a third lateral wall 523, a third extension portion 524, a first protrusion, a second protrusion 525 and a fastening element 526. The first lateral wall 521, the second lateral wall 522 and the third lateral wall 523 of the second sub connector 52 are arranged in sequence to form a second connector accommodation space 528 collaboratively. In other words, the second connector accommodation space 528 is defined by the three lateral walls of the second sub connector 52. The first lateral wall 521 and the third lateral wall 523 of the second sub connector 52 are opposite to each other. The second lateral wall 522 of the second sub connector 52 is connected between the first lateral wall 521 and the third lateral wall 523. The third extension portion 524 is extended from the bottom of the second lateral wall 522 away from the second connector accommodation space 528. The first protrusion is disposed on and protruded from one side of the first lateral wall 521 of the second sub connector 52 away from the second connector accommodation space 528. The second protrusion 525 is disposed on and protruded from one side of the third lateral wall 523 of the second sub connector 52 away from the second connector accommodation space 528. The second protrusion 525 and the first protrusion are corresponding to each other and disposed in two sides of the second sub connector 52, respectively. The fastening element 526 is extended from one side of the first lateral wall 521 of the second sub connector 52 toward the second connector accommodation space 528. The fastening element 526 includes a fastening hole 526a. The fastening element 526 is fixed on the cover 4 by penetrating a screw (not shown) through the fastening hole 526a, so that the second sub connector 52 is fastened on the cover 4.

In this embodiment, the number of the foldable connector 53 is four. Each foldable connector 53 includes a first lateral wall 531, a second lateral wall 532, a third lateral wall 533, a fourth extension portion 534 and a fifth extension portion 535. The first lateral wall 531, the second lateral wall 532, the third lateral wall 533 of the foldable connector 53 are arranged in sequence to form a third connector accommodation space 536 collaboratively. In other words, the third connector accommodation space 536 is defined by the three lateral walls of the foldable connector 53. The first lateral wall 531 and the third lateral wall 533 of the foldable connector 53 are opposite to each other. The second lateral wall 532 of the foldable connector 53 is connected between the first lateral wall 531 and the third lateral wall 533. The fourth extension portion 534 is extended from the bottom of the second lateral wall 532 of the foldable connector 53 away from the third connector accommodation space 536. The fifth extension portion 535 is extended from the top of the second lateral wall 532 toward the third connector accommodation space 536. The first lateral wall 531 of the foldable connector 53 includes a first slide track 531a and a first protrusion. The first slide track 531a is formed on and runs through the first lateral wall 531. The extension direction of the first slide track 531a is from the top toward the bottom of the first lateral wall 531. The first protrusion is disposed on and protruded from one side of the first lateral wall 531 of the foldable connector 53 away from the third connector accommodation space 536. The first protrusion is adjacent to the first slide track 531a. The third lateral wall 533 of the foldable connector 53 includes a second slide track 533a and a second protrusion 533b. The second slide track 533a is formed on and runs through the third lateral wall 533. The extension direction of the second slide track 533a is from the top toward the bottom of the third lateral wall 533. The second protrusion 533b is disposed on and protruded from one side of the third lateral wall 533 of the foldable connector 53 away from the third connector accommodation space 536. The second protrusion 533b is adjacent to the second slide track 533a.

For naming easily, hereinafter, the foldable connectors 53 are referred to as first foldable connector 53, second foldable connector 53, third foldable connector 53 and fourth foldable connector 53 according to the arrangement of the foldable connectors. One of the foldable connectors 53 most adjacent to the first sub connector 51 is the first foldable connector 53, and one of the foldable connectors 53 most adjacent to the second sub connector 52 is the fourth foldable connector 53. In this embodiment, the distance between the first lateral wall 531 and the third lateral wall 533 of the first foldable connector 53 is less than the distance between the first lateral wall 511 and the third lateral wall 513 of the first sub connector 51 for receiving the first foldable connector 53 in the first connector accommodation space 516 of the first sub connector 51. The distance between the first lateral wall 531 and the third lateral wall

533 of the second foldable connector 53 is less than the distance between the first lateral wall 531 and the third lateral wall 533 of the first foldable connector 53 for receiving the second foldable connector 53 in the third connector accommodation space 536 of the first foldable connector 53. The distance between the first lateral wall 531 and the third lateral wall 533 of the third foldable connector 53 is less than the distance between the first lateral wall 531 and the third lateral wall 533 of the second foldable connector 53 for receiving the third foldable connector 53 in the third connector accommodation space 536 of the second foldable connector 53. The distance between the first lateral wall 531 and the third lateral wall 533 of the fourth foldable connector 53 is less than the distance between the first lateral wall 531 and the third lateral wall 533 of the third foldable connector 53 for receiving the fourth foldable connector 53 in the third connector accommodation space 536 of the third foldable connector 53. The distance between the first lateral wall 521 and the third lateral wall 523 of the second sub connector 52 is less than the distance between the first lateral wall 531 and the third lateral wall 533 of the fourth foldable connector 53 for receiving the second sub connector 53 in the third connector accommodation space 536 of the fourth foldable connector 53.

As shown in FIGS. 4, 5A to 6B, the first protrusion of the first foldable connector 53 is slidably disposed in the first slide track 511a of the first lateral wall 511 of the first sub connector 51, and the second protrusion 533b of the first foldable connector 53 is slidably disposed in the second slide track 513a of the third lateral wall 513 of the first sub connector 51, so that the first foldable connector 53 is pivotally connected with the first sub connector 51, and the first foldable connector 53 is received in the first connector accommodation space 516 of the first sub connector 51. The length of the first protrusion of the first foldable connector 53 is equal to the thickness of the first lateral wall 511 of the first sub connector 51. The length of the second protrusion 533b of the first foldable connector 53 is equal to the thickness of the third lateral wall 513 of the first sub connector 51. The first protrusion of the second foldable connector 53 is slidably disposed in the first slide track 531a of the first lateral wall 531 of the first foldable connector 53, and the second protrusion 533b of the second foldable connector 53 is slidably disposed in the second slide track 533a of the third lateral wall 533 of the first foldable connector 53, so that the second foldable connector 53 is pivotally connected with the first foldable connector 53, and the second foldable connector 53 is received in the third connector accommodation space 536 of the first foldable connector 53. The length of the first protrusion of the second foldable connector 53 is equal to the thickness of the first lateral wall 531 of the first foldable connector 53. The length of the second protrusion 533b of the second foldable connector 53 is equal to the thickness of the third lateral wall 533 of the first foldable connector 53. Similarly, the third foldable connector 53 is pivotally connected with the second foldable connector 53, so that the third foldable connector 53 is received in the third connector accommodation space 536 of the second foldable connector 53. The fourth foldable connector 53 is pivotally connected with the third foldable connector 53, so that the fourth foldable connector 53 is received in the third connector accommodation space 536 of the third foldable connector 53. The first protrusion of the second sub connector 52 is slidably disposed in the first slide track 531a of the first lateral wall 531 of the fourth foldable connector 53, and the second protrusion 525 of the second sub connector 52 is slidably disposed in the second slide track 533a of the third lateral wall 533 of the fourth foldable connector 53, so that the second sub connector 52 is pivotally connected with the fourth foldable connector 53, and the second sub connector 52 is received in the third connector accommodation space 536 of the fourth foldable connector 53. The length of the first protrusion of the second sub connector 52 is equal to the thickness of the first lateral wall 531 of the fourth foldable connector 53. The length of the second protrusion 525 of the second sub connector 52 is equal to the thickness of the third lateral wall 533 of the fourth foldable connector 53. Certainly, the number of the foldable connector 53 is not limited and can be changed by the practical requirement.

In this embodiment, as shown in FIG. 4, the second protrusion 533b of the first foldable connector 53 is disposed in one side of the second slide track 533a away from the second lateral wall 532. The second protrusion 533b of the second foldable connector 53 is disposed in one side of the second slide track 533a adjacent to the second lateral wall 532. The second protrusion 533b of the third foldable connector 53 is disposed in one side of the second slide track 533a away from the second lateral wall 532. The second protrusion 533b of the fourth foldable connector 53 is disposed in one side of the second slide track 533a adjacent to the second lateral wall 532. It is not shown in FIG. 4, but the arrangement of the first protrusion is similar to the arrangement of the second protrusion. For example, the first protrusion of the first foldable connector 53 is disposed in one side of the first slide track 531a away from the second lateral wall 532. The first protrusion of the second foldable connector 53 is disposed in one side of the first slide track 531a adjacent to the second lateral wall 532. The first protrusion of the third foldable connector 53 is disposed in one side of the first slide track 531a away from the second lateral wall 532. The first protrusion of the fourth foldable connector 53 is disposed in one side of the first slide track 531a adjacent to the second lateral wall 532. In other words, the foldable connectors with the protrusions disposed farer away from the second lateral walls 532 thereof and the foldable connectors with the protrusions disposed nearer the second lateral walls 532 thereof are alternately arranged and connected. Certainly, the arrangement of the protrusions of the first foldable connector 53 and the third foldable connector 53 can be changed with the arrangement of the protrusions of the second foldable connector 53 and the fourth foldable connector 53. Consequently, the area of the lateral wall of the foldable connector can be reduced according to the arrangement of the first protrusion and the second protrusions.

As shown in FIGS. 5A and 5B, when the chamber 1 is in the open operation, the upper surface of the fourth extension portion 534 of the first foldable connector 53 is attached with the lower surface of the second extension portion 515 of the first sub connector 51. The first protrusion of the first foldable connector 53 slides to one side of the first slide track 511a adjacent to the top of the first lateral wall 511 of the first sub connector 51. The second protrusion 533b of the first foldable connector 53 slides to one side of the second slide track 513a adjacent to the top of the third lateral wall 533 of the first sub connector 51. The first foldable connector 53 is engaged with the first sub connector 51. The upper surface of the fourth extension portion 534 of the second foldable connector 53 is attached with the lower surface of the fifth extension portion 535 of the first foldable connector 53. The first protrusion of the second foldable connector 53 slides to one side of the first slide track 531a adjacent to the top of the first lateral wall 531 of the first foldable connector 53. The second protrusion 533b of the second foldable connector 53 slides to one side of the second slide track 533a adjacent to the top of the third lateral wall 533 of the first foldable connector 53. The second foldable connector 53 is engaged with the first foldable connector 53. Similarly, the third foldable connector 53 is engaged with the second foldable connector 53, and the fourth foldable connector 53 is engaged with the third foldable connector 53. The upper surface of the third extension portion 524 of the second sub connector 52 is attached with the lower surface of the fifth extension portion 535 of the fourth foldable connector 53. The first protrusion of the second sub connector 52 slides to one side of the first slide track 531a adjacent to the top of the first lateral wall 531 of the fourth foldable connector 53. The second protrusion 525 of the second sub connector 52 slides to one side of the second slide track 533a adjacent to the top of the third lateral wall 533 of the fourth foldable connector 53. The second sub connector 52 is engaged with the fourth foldable connector 53.

As shown in FIGS. 6A and 6B, when the chamber 1 is in the close operation, the upper surface of the fourth extension portion 534 of the first foldable connector 53 is gradually leaving away from the lower surface of the second extension portion 515 of the first sub connector 51. The first protrusion of the first foldable connector 53 slides to one side of the first slide track 511a adjacent to the bottom of the first lateral wall 511 of the first sub connector 51. The second protrusion 533b of the first foldable connector 53 slides to one side of the second slide track 513a adjacent to the bottom of the third lateral wall 513 of the first sub connector 51. The first foldable connector 53 is received in the first connector accommodation space 516 of the first sub connector 51. The upper surface of the fourth extension portion 534 of the second foldable connector 53 is gradually leaving away from the lower surface of the fifth extension portion 535 of the first foldable connector 53. The first protrusion of the second foldable connector 53 slides to one side of the first slide track 511a adjacent to the bottom of the first lateral wall 531 of the first foldable connector 53. The second protrusion 533b of the second foldable connector 53 slides to one side of the second slide track 533a adjacent to the bottom of the third lateral wall 533 of the first foldable connector 53. The second foldable connector 53 is received in the third connector accommodation space 536 of the first foldable connector 53. Similarly, the third foldable connector 53 is received in the third connector accommodation space 536 of the second foldable connector 53. The fourth foldable connector 53 is received in the third connector accommodation space 536 of the third foldable connector 53. The upper surface of the third extension portion 524 of the second sub connector 53 is gradually leaving away from the lower surface of the fifth extension portion 535 of the fourth foldable connector 53. The first protrusion of the second sub connector 52 slides to one side of the first slide track 531a adjacent to the bottom of the first lateral wall 531 of the fourth foldable connector 53. The second protrusion 525 of the second sub connector 52 slides to one side of the second slide track 533a adjacent to the bottom of the third lateral wall 533 of the fourth foldable connector 53. The second sub connector 53 is received in the third connector accommodation space 536 of the fourth foldable connector 53.

As mentioned above, the connector of the chamber includes the first sub connector, the second sub connector and the plurality of foldable connectors. Each wire can be covered by the connector and does not need to be exposed. The wire is protected and organized, and the appearance of the chamber is aesthetically pleasing. Moreover, when the chamber is in the close operation, the protrusion of each sub connector is disposed in the slide track of the former sub connector, and each sub connector is received in the accommodation space of the former sub connector, so that the requirement space of the connector is reduced and the volume of the chamber is reduced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A connector pivotally connected between a box and a cover, comprising:

a first sub connector disposed in the box and comprising three lateral walls and a first connector accommodation space defined by the three lateral walls of the first sub connector, and a slide track formed on and running through the at least one of the three lateral walls of the first sub connector;

a second sub connector disposed in the cover and comprising three lateral walls and a second connector accommodation space defined by the three lateral walls of the second sub connector, and a protrusion disposed on an outer surface of at least one of the three lateral walls of the second sub connector; and a plurality of foldable connectors disposed between the first sub connector and the second sub connector in sequence, wherein each of the plurality of foldable connectors comprises three lateral walls and a third connector accommodation space defined by the three lateral walls of each of the plurality of foldable connectors, a slide track formed on and running through the at least one of the three lateral walls of each of the plurality of foldable connectors, and a protrusion disposed on an outer surface of the lateral wall having the slide track of each of the plurality of foldable connectors;

wherein the protrusion of a first foldable connector of the plurality of foldable connectors is slidably disposed in the slide track of the first foldable connector to make the first foldable connector of the plurality of foldable connectors received in the first connector accommodation space, the protrusion of another foldable connector of the plurality of foldable connectors is slidably disposed in the slide track of former one of the plurality of foldable connectors to make another foldable connector of the plurality of foldable connectors received in the third connector accommodation space of the former one of the plurality of foldable connectors, and the protrusion of the second sub connector is slidably disposed in the slide track of a last one of the plurality of foldable connectors to make the second sub connector received in the third connector accommodation space of the last one of the plurality of foldable connectors.

2. The connector according to claim 1, wherein the three lateral wall of the first sub connector comprises a first lateral wall, a second lateral wall and a third lateral wall, the first lateral wall, the second lateral wall and the third lateral wall are arranged in sequence, the first lateral wall and the third lateral wall of the first sub connector are opposite to each other, wherein the slide track of the first sub connector runs through the first lateral wall or the third lateral wall of the first sub connector, and an extension direction of the slide track of the first sub connector is from a top toward a bottom of the corresponding lateral wall of the first sub connector.

3. The connector according to claim 2, wherein the first sub connector comprises a first extension portion and a second extension portion, the first extension portion is extended from a bottom of the first lateral wall, a bottom of the second lateral wall and a bottom of the third lateral wall away from the first connector accommodation space, and the second extension portion is extended from a top of the second lateral wall toward the first connector accommodation space.

4. The connector according to claim 2, wherein the three lateral walls of each of the plurality of foldable connectors comprises a first lateral wall, a second lateral wall and a third lateral wall, the first lateral wall, the second lateral wall and the third lateral wall of each of the plurality of foldable connectors are arranged in sequence, the first lateral wall and the third lateral wall of each of the plurality of foldable connectors are opposite to each other, the slide track of each of the plurality of foldable connectors runs through the first lateral wall or the third lateral wall, an extension direction of the slide track of each of the plurality of foldable connectors is from a top toward a bottom of the corresponding lateral walls of each of the plurality of foldable connectors, and the protrusion of each of the plurality of foldable connectors is disposed on the first lateral wall or the third lateral wall.

5. The connector according to claim 4, wherein each of the plurality of foldable connectors comprises a fourth extension portion and a fifth extension portion, the fourth extension portion is extended from a bottom of the second lateral wall of the foldable connector away from the third connector accommodation space, and the fifth extension portion is extended from the top of the second lateral wall of the foldable connectors toward the third connector accommodation space.

6. The connector according to claim 4, wherein a distance between the first lateral wall and the third lateral wall of the first foldable connector is less than a distance between the first lateral wall and the third lateral wall of the first sub connector, a distance between the first lateral wall and the third lateral wall of another foldable connector of the plurality of foldable connectors is less than a distance between the first lateral wall and the third lateral wall of the former foldable connector of the plurality of foldable connectors.

7. The connector according to claim 4, wherein a length of the protrusion of the first foldable connector is equal to a thickness of the first lateral wall or the third lateral wall having the slide track of the first sub connector, and a length of the protrusion of another foldable connector of the plurality of foldable connectors is equal to a thickness the first lateral wall or third lateral wall having the slide track of the former foldable connector of the plurality of foldable connectors.

8. The connector according to claim 4, wherein some protrusions of the foldable connectors are disposed farer away from the second lateral walls of the foldable connectors than the slide tracks are, and other protrusions of the foldable connectors are disposed nearer the second lateral walls of the foldable connectors than the slide tracks are.

9. The connector according to claim 8, wherein the foldable connectors with the protrusions disposed farer away from the second lateral walls thereof and the foldable connectors with the protrusions disposed nearer the second lateral walls thereof are alternately arranged and connected.

10. The connector according to claim 4, wherein the three lateral walls of the second sub connector comprises a first lateral wall, a second lateral wall and a third lateral wall, the first lateral wall, the second lateral wall and the third lateral wall of the second sub connector are arranged in sequence, the first lateral wall and the third lateral wall of the second sub connector are opposite to each other, and the protrusion of the second sub connector is disposed in the outer surface of the first lateral wall or the outer surface of the third lateral wall of the second sub connector.

11. The connector according to claim 10, wherein the second sub connector comprises a third extension portion extended from a bottom of the second lateral wall of the second sub connector away from the second connector accommodation space.

12. The connector according to claim 10, wherein a distance between the first lateral wall and the third lateral wall of the second sub connector is less than a distance between the first lateral wall and the third lateral wall of the last one of the plurality of foldable connectors.

13. The connector according to claim 10, wherein a length of the protrusion of the second sub connector is equal to a thickness of the first lateral wall or third lateral wall having the slide track of the last one of the foldable connectors.

14. A chamber, comprising:
a box;
a cover;
at least one wire; and
a connector pivotally connected between the box and the cover, and comprises:
a first sub connector disposed in the box and comprising three lateral walls and a first connector accommodation space defined by the three lateral walls of the first sub connector, and a slide track formed on and running through the at least one of the three lateral walls of the first sub connector;

a second sub connector disposed in the cover and comprising three lateral walls and a second connector accommodation space defined by the three lateral walls of the second sub connector, and a protrusion disposed on an outer surface of at least one of the three lateral walls of the second sub connector; and
a plurality of foldable connectors disposed between the first sub connector and the second sub connector in sequence, wherein each of the plurality of foldable connectors comprises three lateral walls and a third connector accommodation space defined by the three lateral walls of each of the plurality of foldable connectors, a slide track formed on and running through the at least one of the three lateral walls of each of the plurality of foldable connectors, and a protrusion disposed on an outer surface of the lateral wall having the slide track of each of the plurality of foldable connectors;
wherein the protrusion of a first foldable connector of the plurality of foldable connectors is slidably disposed in the slide track of the first foldable connector to make the first foldable connector of the plurality of foldable connectors received in the first connector accommodation space, the protrusion of another foldable connector of the plurality of foldable connectors is slidably disposed in the slide track of former one of the plurality of foldable connectors to make another foldable connector of the plurality of foldable connectors received in the third connector accommodation space of the former one of the plurality of foldable connectors, and the protrusion of the second sub connector is slidably disposed in the slide track of a last one of the plurality of foldable connectors to make the second sub connector received in the third connector accommodation space of the last one of the plurality of foldable connectors.

* * * * *